(12) United States Patent
Bakkaloglu et al.

(10) Patent No.: US 7,528,754 B1
(45) Date of Patent: May 5, 2009

(54) FINITE IMPULSE RESPONSE DIGITAL TO ANALOG CONVERTER

(75) Inventors: Bertan Bakkaloglu, Scottsdale, AZ (US); Sayfe Kiaei, Fountain Hills, AZ (US); Shahin Taleie, San Diego, CA (US)

(73) Assignee: Arizona Board of Regents, Tempe, AZ (US)

( * ) Notice: Subject to any disclaimer, the term of this patent is extended or adjusted under 35 U.S.C. 154(b) by 45 days.

(21) Appl. No.: 11/672,810

(22) Filed: Feb. 8, 2007

Related U.S. Application Data

(60) Provisional application No. 60/771,661, filed on Feb. 9, 2006.

(51) Int. Cl.
*H03M 3/00* (2006.01)

(52) U.S. Cl. .................. 341/143; 341/136; 341/144; 375/295

(58) Field of Classification Search ............. 341/143, 341/144; 375/295
See application file for complete search history.

(56) References Cited

U.S. PATENT DOCUMENTS

| | | | |
|---|---|---|---|
| 5,323,157 A * | 6/1994 | Ledzius et al. ............. | 341/143 |
| 6,317,468 B1 * | 11/2001 | Meyer ....................... | 375/269 |
| 7,061,989 B2 * | 6/2006 | Bellaouar et al. ........... | 375/295 |
| 7,218,085 B2 | 5/2007 | Abedinpour et al. | |
| 7,256,720 B2 * | 8/2007 | Fukuda ...................... | 341/143 |
| 2006/0052988 A1 | 3/2006 | Farahani et al. | |
| 2006/0226909 A1 | 10/2006 | Abdeinpour et al. | |
| 2007/0033000 A1 | 2/2007 | Kiaei et al. | |

OTHER PUBLICATIONS

Luschas et al., "Radio frequency D/A converter," IEEE Journal of Solid State Circuits, Sep. 2004, 39(9): 1462-167.

Taleie, et al., "Highly linear Σ-Δ digital IF to RF DAC transmitter with embedded mixer," IEEE Transactions on Microwave Theory and Techniques, May 2008, 56(5):1059-1068.

Terrovitis et al., "Intermodulation distortion in current-commutating CMOS mixers," IEEE Journal of Solid States Circuits, Oct. 2000, 35(10):1461-1473.

Terrovitis, et al., "Noise in current-commutating CMOS mixers," IEEE Journal of Solid State Circuits, Dec. 1999, 34:1869-1880.

Barkin, et al., "A CMOS oversampling bandpass cascade D/A converter with digital FIR and current-mode semi-digital filtering," IEEE Journal of Solid State Circuits, Apr. 2004, 39(4):585-593.

van der Wel, et al., "Effect of switched biasing on 1/f noise and random telegraph signals in deep-submicron MOSFETS," Electronics Letters, Jan. 2001, 37(1):55-56.

(Continued)

*Primary Examiner*—Khai M Nguyen
(74) *Attorney, Agent, or Firm*—McDonnell Boehnen Hulbert & Berghoff LLP

(57) ABSTRACT

A noise-shaped direct digital IF to RF DAC (DIF2RF) with embedded up-converter mixer is presented. The digital IF signal is noised shaped by a band-pass ΣΔ modulator with a single bit IF output followed by a semi-digital current-mode IF filter to attenuate out-of-band quantization noise. A current steering DAC combines scaled values of local oscillator (LO) signals as current sources for performing current steering and upconversion in a single cell.

19 Claims, 5 Drawing Sheets

OTHER PUBLICATIONS

Leung, et al., "Digital-IF WCDMA handset transmitter IC in 0.25mm SiGe BiCMOS," IEEE Journal of Solid State Circuits, Dec. 2004, 39(12):2215-2225.

Schofield, et al., "A 16b 400MS/s DAC with <-80dBc IMD to 300MHz ad <-160dBm.Hz noise power spectral density," ISSCC Digital Tech Papers, Feb. 2003, pp. 126-127.

Taleie, et al., "Supplement: A bandpass ΣΔ RF-DAC with embedded FIR reconstruction filter," Solid-State Circuits Conference, 2006. ISSCC 2006. Digest of Technical Papers, IEEE International, Feb. 2006, pp. 2370-2379.

* cited by examiner

FINITE IMPULSE RESPONSE DIGITAL TO ANALOG CONVERTER

CROSS-REFERENCE TO RELATED APPLICATIONS

The present patent application claims priority under 35 U.S.C. § 119(e) to U.S. Provisional Patent Application Ser. No. 60/771,661, filed on Feb. 9, 2006, the entire contents of which are incorporated herein by reference as if fully set forth in this description.

FIELD OF THE INVENTION

The present application relates to digital to analog converters and, more particularly, to digital to analog converters for radio frequency use. In one instance, the present application concerns a single-bit bandpass sigma-delta ($\Sigma\Delta$) digital to analog converter (DAC) containing a current-steering finite impulse response (FIR) reconstruction filter with an embedded upconversion mixer.

BACKGROUND

Advancement in the wireless communications industry and the demand for high-data rate multi-media wireless connectivity has put stringent requirements on transceivers in terms of monolithic integration, power consumption, linearity, efficiency and noise. In some cases, these requirements are critical for a transmitter due to linearity, poor efficiency, and size of external components.

Heterodyne and direct conversion (homodyne) architectures have become widely adopted in wireless transmitter designs. To ensure reliable reception of a radio frequency (RF) signal, it may be necessary to down-convert the signal to baseband signals, filter out noise and interfering signals, and then demodulate the signal with a modem. Heterodyne designs have architectures that first down-convert a signal to intermediate frequency (IF) for efficient channel selection and then filter the signal to remove interfering signals, and amplify the signal for another step of down-conversion to the baseband frequency. Heterodyne transmitters have good I/Q matching (in-phase and quadrature signal matching), low local oscillation (LO) leakage, and high linearity, while wide range gain control can readily be implemented despite poor substrate isolation. However, off-chip surface acoustic wave (SAW) filters are required for both image rejection as well as to remove spurious harmonics at the output. Furthermore, the two sets of down-converters and respective LO synthesizers lead to a complex and area/power inefficient design. On the other hand, direct conversion transmitters do not require any image rejection filter, but such transmitters suffer from DC offset due to LO leakage and I/Q mismatch, thus degrading error vector magnitude (EVM).

Potentially, a modification of the heterodyne architecture allows a good tradeoff between the simplicity of homodyne systems and the performance of heterodyne systems. Such a modified architecture includes a first stage of up-conversion from baseband to IF performed digitally with quadrature local oscillators. By using $F_{IF}=F_s/4$, the design of a digital quadrature modulator simplifies because the digital mixer's operation becomes either multiplying by 0 or bit sign flipping. Therefore, the digital mixer performs an inherently linear operation. After the first IF mixer, the in-phase and quadrature signals are added and a resulting signal (i.e., Nyquist rate or oversampled and noise shaped digital bitstream) is converted by a digital to analog converter (DAC). For very high speed digital to analog converters (update rates in the range of hundreds of MHz) targeted in digital-IF architectures, current steering DACs have become a desired option.

In a typical digital transmitter, a current steering DAC is followed by a transimpedance stage, a reconstruction filter, a variable gain amplifier (VGA) and an upconverting mixer. Each additional component degrades the linearity, I/Q matching, error vector magnitude (EVM), and spurious-free dynamic range (SFDR) of the transmitter output. It would thus be desirable to eliminate a number of additional components needed while still maintaining the necessary signal conversion within a transmitter.

SUMMARY

Within embodiments disclosed below, a finite impulse response digital to analog converter system architecture containing an embedded upconversion mixer is provided. The system may take the form of a radio frequency transmitter that includes a bandpass $\Sigma\Delta$ modulator for receiving digital input samples and converting the digital input samples to a one-bit data stream, and a finite impulse response radio frequency digital-to-analog converter (FIR RF DAC) coupled to the bandpass $\Sigma\Delta$ modulator that transforms the one-bit data stream into a radio frequency signal.

In one respect, the digital to analog converter (DAC) may include a finite impulse response (FIR) filter, a tapped delay line, and a first and second output path. The finite impulse response (FIR) filter transforms a digital input signal to a bandpass response centered at a sampling frequency. The tapped delay line receives the bandpass response from the FIR filter. Each unit of the tapped delay line includes a mixer and an amplifier transistor to generate an analog current, and each unit of the tapped delay line further includes a first transistor and a second transistor to steer the analog current to a desired output path based on a value of the bandpass response. The first output path receives the analog current from the first transistor from each tapped delay line and outputs a first analog voltage across a first output resistor. The first analog voltage is due to a sum of analog currents received from units of the tapped delay line and propagated across the first output resistor. Similarly, the second output path receives the analog current from the second transistor from each tapped delay line and outputs a second analog voltage across a second output resistor. The second analog voltage is due to a sum of analog currents received from units of the tapped delay line and propagated across the second output resistor.

In another respect, a method is provided for converting a digital signal to an analog signal. The method includes receiving a digital input signal and transforming the digital input signal to a bandpass response centered at a sampling frequency. The method also includes generating a plurality of analog currents, providing each of the plurality of analog currents to a desired output path based on a value of the bandpass response, and outputting an analog voltage across an output resistor due to a sum of analog currents received.

These and other aspects will become apparent to those of ordinary skill in the art by reading the following detailed description, with reference where appropriate to the accompanying drawings. Further, it should be understood that the embodiments noted herein are not intended to limit the scope of the invention as claimed.

DETAILED DESCRIPTION

The present disclosure provides for a novel digital to analog converter (DAC) architecture that embeds an up-conversion mixer inside the DAC and takes advantage of a Finite Impulse Response (FIR) topology of unit current sources to provide out-of-band quantization noise filtering at Radio Frequencies (RF). The DAC is suitable for transforming a digital bandpass sigma delta ($\Sigma\Delta$) modulated signal to a noise shaped analog waveform at radio frequency. Thus, by combining the three blocks of conversion, filtering and mixing, the present disclosure provides a more efficient manner for processing a signal and uses less silicon die area than previous designs. Because the resulting signal processor effectively converts, filters and mixes the signal, the design has been referred to as a FIR RF DAC since the design uses the idea FIR filter topology for an RF DAC.

The novel DAC presented here can use known RF-DAC concepts to up-convert intermediate frequency (IF) signals to a radio frequency (RF) band. However, in the present design, use of "dynamic element matching" for linearizing the DAC may not be needed. Therefore, digital power consumption is reduced.

To accomplish aspects of the present design, a single bit DAC is used instead of a multi-bit, and a discrete-time-to-continuous-time (DT/CT) interface is based on FIR filtering to suppress out-of-band quantization noise. This allows for high linearity owing to the single bit ($\Sigma\Delta$)-DAC, and feasibility to migrate to deep sub-micron CMOS technologies due to use of small current sources, less need for a cascode impedance boosting transistor, and reduction of power consumption.

Figure 1:
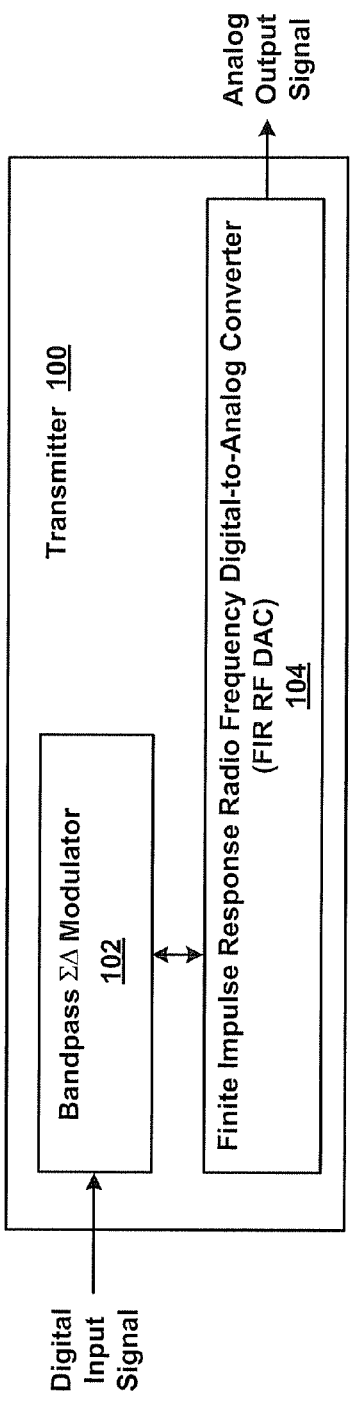
FIG. 1 illustrates a block diagram of an example of a transmitter according to exemplary embodiments.

Referring now to the figures, FIG. 1 illustrates a block diagram of an example of a transmitter 100 according to exemplary embodiments disclosed herein. The transmitter 100 includes a bandpass $\Sigma\Delta$ modulator 102 coupled to a finite impulse response radio frequency digital-to-analog converter (FIR RF DAC) 104. The bandpass $\Sigma\Delta$ modulator 102 receives a digital signal from any of a number of components. For example, the transmitter 100 may be within a cellular telephone, and the digital signal may be that of a data message. The digital signal is typically at a low frequency (i.e., 10 to 100 MHz), and thus, the transmitter receives the low frequency signal, and outputs an analog signal that is at a higher frequency (i.e., 1 or 2 GHz). This is beneficial because it is difficult to pass low frequency signals out of an antenna, for example.

Characteristics that determine the performance quality of a DAC include resolution, sampling rate, linearity and monotonicity. Resolution is the number of bits of digital input code used to produce the corresponding analog output signal. Sigma-delta ($\Sigma$-$\Delta$) (or delta-sigma modulation) provides a high resolution digital-to-analog conversion solution. $\Delta$-modulation requires an integrator ($\Sigma$) to reconstruct the analog signal. Moving the integrator ($\Sigma$) in front of the $\Delta$-modulator can simplify the design of a last stage filter. This is due to the different spectrum shaping of the two types of modulation: $\Delta\Sigma$-modulation shapes the noise, leaving the signal as it is, while $\Delta$-modulation leaves the noise as it is and shapes the spectrum of the signal, which then has to be reconstructed by the aforementioned integrator.

The bandpass $\Sigma\Delta$ modulator 102 makes rough evaluations of the digital input signal to measure error, integrate the signal and then compensate for the error. The mean output value is then equal to the mean input value if the integral of the error is finite. The number of integrators, and consequently, the numbers of feedback loops, indicates the order of a $\Sigma$-$\Delta$ modulator.

Specifically, the bandpass $\Sigma\Delta$ modulator 102 receives the digital input samples and converts the samples to a lower resolution (e.g., one-bit) bit stream. Rather than spreading quantization noise uniformly over the frequency range from 0 to the sampling Nyquist frequency, the bandpass $\Sigma\Delta$ modulator 102 shapes the noise so that the majority of the noise falls into high frequencies above the Nyquist frequency. Subsequently, applying a digital filter to the noise-shaped delta-sigma modulator can remove more noise than simply oversampling, for example. Thus, the output of the bandpass $\Sigma\Delta$ modulator 102 is a one-bit data stream at the sampling rate.

The FIR RF DAC 104 receives the one-bit data stream and provides a corresponding analog output current or voltage signal in the form of a radio frequency signal ready for transmission. Thus, the FIR RF DAC 104 converts the digital signal into a continuous-time range analog signal. Generally, the FIR RF DAC 104 converts a digital signal to analog voltages by assigning a voltage weight, or current weight, to each bit in the digital signal and summing the voltage or current weights of the entire code. The FIR RF DAC 104 may include an encoder, a number of analog output elements and a summing circuit. The encoder receives a digital input, which is a digital value represented by a number of binary data bits, and then encodes the binary data bits into suitable drive signals to selectively activate the analog output elements. In response to the drive signals, the activated analog output elements generate partial analog signals. These partial analog signals are then combined by the summing circuit to produce an analog output, which is an analog representation of the digital input.

Figure 2:
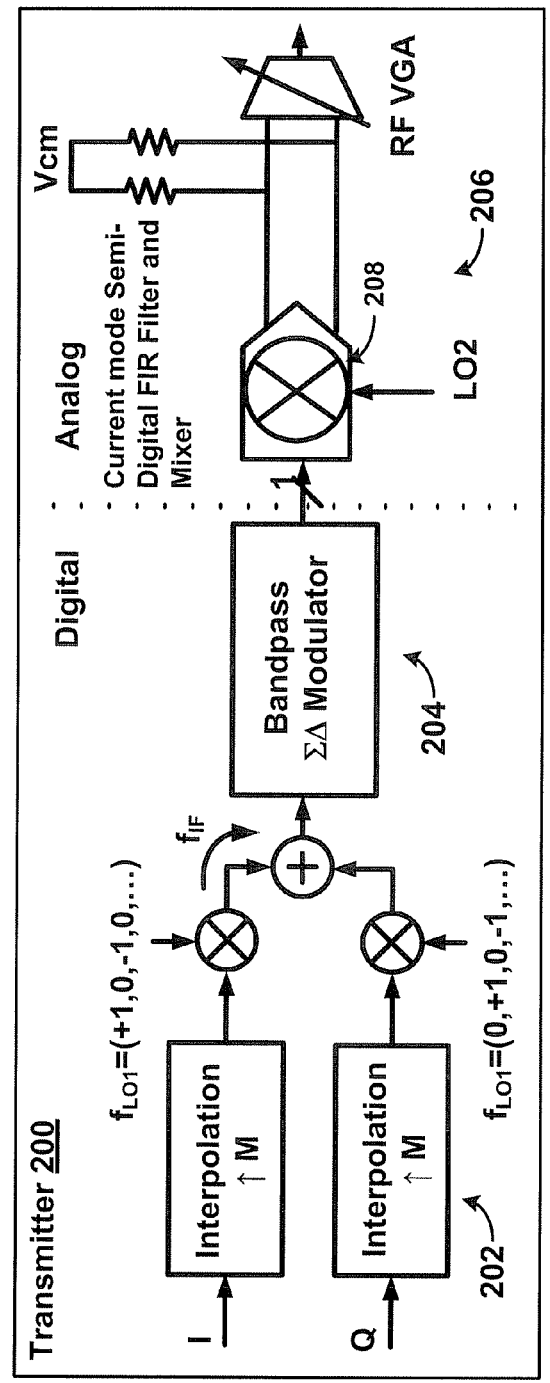
FIG. 2 illustrates another block diagram of an example of a transmitter according to exemplary embodiments.

FIG. 2 illustrates another block diagram of an example of a transmitter 200 according to exemplary embodiments disclosed herein. The transmitter 200 is a direct digital IF to RF (DIF-RF) transmitter which utilizes the DAC with an embedded up-converter mixer. The transmitter 200 includes digital I/Q mixers 202 that translate baseband signals to intermediate frequency $F_{IF}=\Omega_{IF}/2\pi=F_s/4$. The I and Q signals are defined by the Equations shown below.

$$I=I(n)\cos(\Omega_{IF}\cdot n)$$

$$Q=-Q(n)\sin(\Omega_{IF}\cdot n) \quad\quad\quad \text{Equation (1)}$$

Since the quadrature modulation is in the digital domain, there is no source of mismatch in analog phase or amplitude, and theoretically, the I/Q mixers 202 can achieve matching. In this example, the combined I/Q signal at $F_{IF}$ is then modulated by a 4th order one-bit bandpass ΔΣ noise shaper 204. The noise transfer function of the ΔΣ noise shaper 204 can be written as:

$$NTF(z)=(1+z^{-2})^2 \quad\quad\quad \text{Equation (2)}$$

In this example, sampling frequencies Fs=250 and 125 MHz can be used that correspond to $F_{IF}$=62.5 and 31.25 MHz, respectively.

The ΔΣ noise shaper 204 outputs to a DAC 206. A single balanced mixer 208 embedded in the DAC 206 translates the IF signal to 1 GHz RF. The single balanced mixer 208 provides both the upper and lower side band (LSB), and thus an external filter (not shown) may be required to remove the LSB signal and avoid spillage into the radio frequency band. In this regard, a higher IF (that is, higher Fs) may relax filter requirements for removing the LSB. On the other hand, higher Fs may lead to power hungry digital blocks and a more demanding design of the digital to analog interface.

In one embodiment, a technique that can be used to embed a mixer into the DAC is proposed in Luschas et al., "Radio frequency D/A converter", IEEE Journal of Solid State Circuits, vol. 39, no. 9, pp 1462-1467, September 2004, which is incorporated by reference herein as if fully set forth in this disclosure. In that design, a tail current source of a 9-level ΣΔ DAC is modulated with a local oscillator, targeting an upconverted center frequency of 942 MHz with a signal bandwidth of 17 MHz. The design achieved a 70 dBc overall 3rd order intermodulation (1M3) at the RF frequency. Out-of band filtering of quantization noise can be achieved by external filtering.

Figure 3:
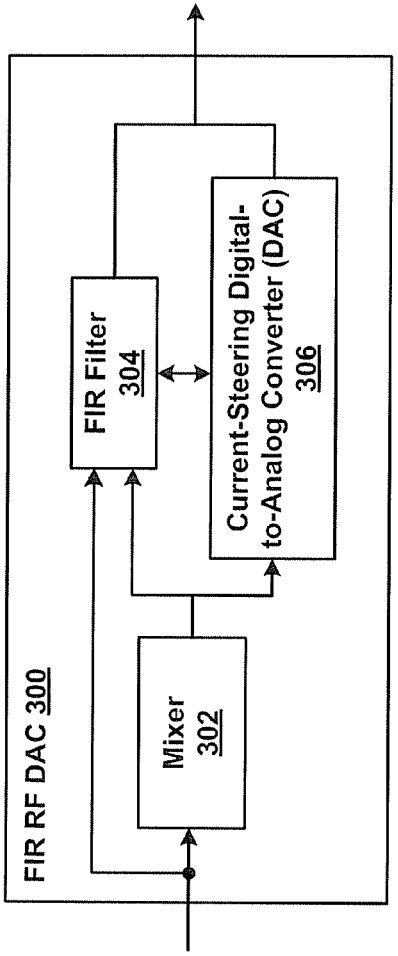
FIG. 3 is an illustration of a block diagram showing an example of an FIR RF DAC according to exemplary embodiments.

FIG. 3 is an illustration of a block diagram showing an example of an FIR RF DAC 300 according to exemplary embodiments described herein. The FIR RF DAC 300 includes a mixer 302, an FIR filter 304 and a current-steering DAC 306. The mixer 302 is part of the current-steering DAC 306 and provides periodic current at local oscillator frequency (LO frequency) as unit currents of the DAC. The FIR filter 304 digitally filters the digital input of the DAC 306. The FIR filter 304, along with the DAC 306, are referred to as a semi-digital FIR filter. As an example, an LO signal output from mixer 302 at 1 GHz generates a sinusoidal current at 1 GHz, and a digital IF input at 62.5 MHz drive the switches in the DAC 306, steering the RF current of the mixer to a positive or negative output (depending on the digital input bit). The current of LO generated by the mixer and the switching due to the IF signal is a multiplication of two signals in time-domain. Therefore, the output is at 1 GHz±62.5 MHz.

The current-steering DAC 306 can be implemented using an array of matched current sources that are unity decoded or binary weighted. In general, a current-mode DAC includes an array of current sources that are individually switched on or off in response to a control input. The current source outputs can be combined to yield a total current that is proportional to the number of switched-on current sources. Currents are switched to outputs or ground by switches. The output currents are transformed into voltages by resistors and amplifiers. When a bit is provided to one of the switches that is "on", the switch is closed, thereby enabling current to flow in the respective branch. A current mode DAC generates a differential current output that is typically applied to a current-to-voltage converting amplifier to produce a differential voltage output.

Figure 4:
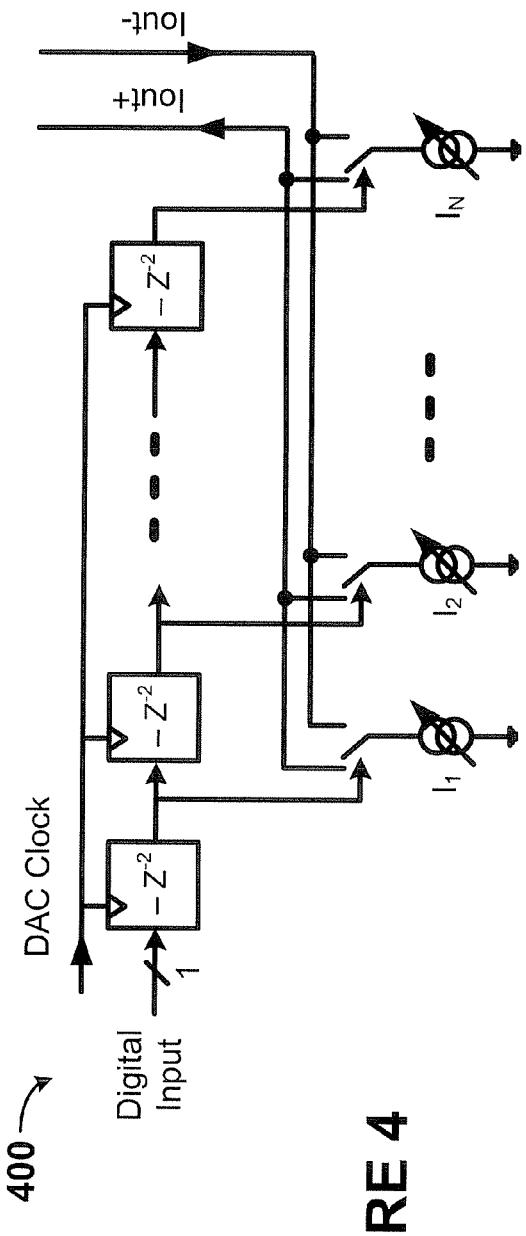
FIG. 4 is a circuit-level diagram of one example of an FIR filter.

FIG. 4 is a circuit level diagram of one example of an FIR filter 400 embedded within a DAC, as described in FIG. 3. The FIR filter 400 includes a digital delay line with a cascade of $-Z^2$ blocks that transform the N-tap lowpass FIR response to a bandpass response centered at $F_s/4$. The N-tap bandpass FIR filter transfer function, in a general form, is given by:

$$H(z)=-a_1 \cdot z^{-2}+a_2 \cdot z^{-4}- \ldots +(-1)^N a_N \cdot z^{-2N} \quad\quad \text{Equation (3)}$$

The order of the FIR filter is designed to be based on a spectrum emission mask defined in an application standard and a quantization noise profile of the noise shaper (e.g., ΣΔ bandpass filter). By increasing the number of taps and reducing a sampling frequency, the notches of the frequency response become closer to the IF, thus providing more attenuation of the quantization noise. On the other hand, a very narrowband filter can cause in-band gain droop and mandate a pre-emphasis digital filter after the noise shaping.

The FIR filter 400 is basically a current source driving a load impedance, and thus a high output impedance is desired. Therefore, a large number of taps decreases the output impedance and affects the linearity of the current source. Filter coefficients are set to be symmetric around the center tap. Thus, the FIR filter 400 features a linear phase response to minimize the group delay. Mismatch among FIR filter coefficients (i.e., ratios of the current sources) alters the filter transfer function but does not introduce nonlinearity in the signal path-therefore, the system maintains the inherent linearity of a one-bit D/A interface.

Figure 5:
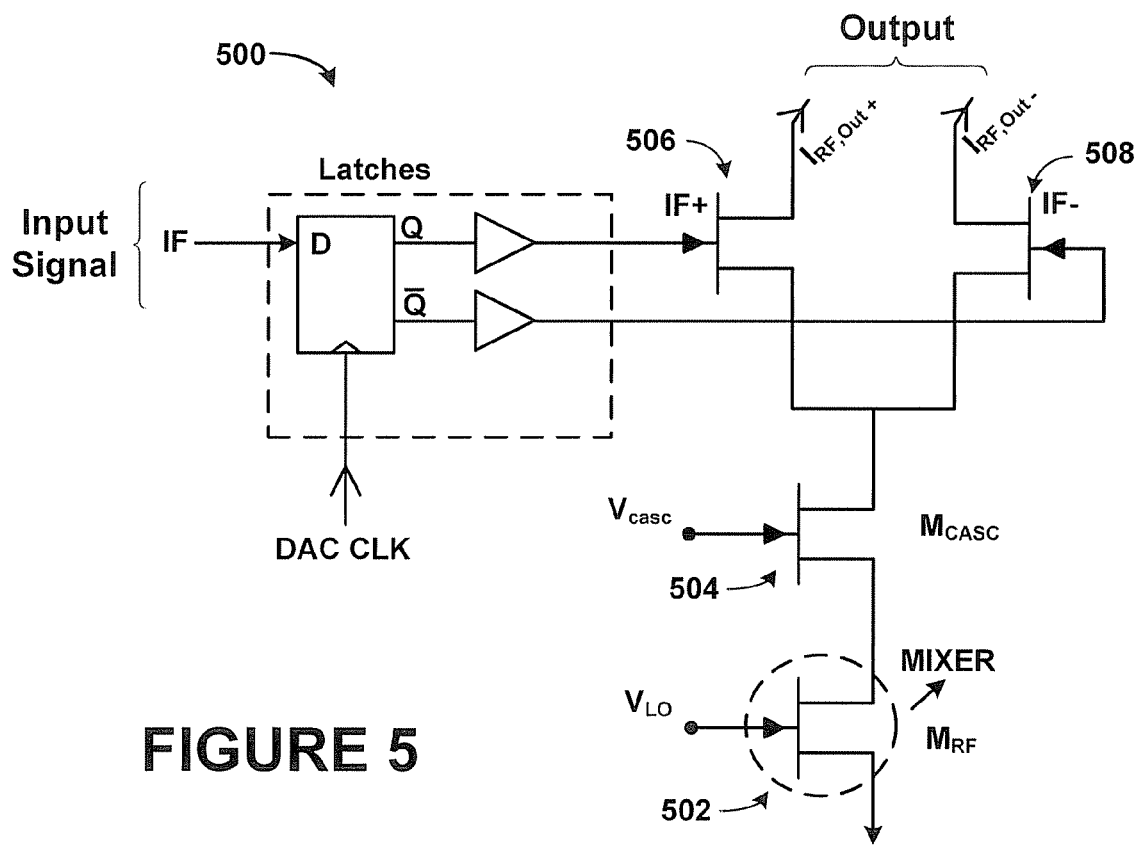
FIG. 5 is a circuit-level diagram of one example of a unit FIR tap.

An example circuit-level implementation of a unit FIR tap 500 embedded within a DAC is shown in FIG. 5. The unit FIR tap 500 is one of the taps within the digital delay line of the FIR filter 400 in FIG. 4. Transistor 502 at the bottom ("MRF") is a mixer and transistor 504 ("MCASC") is used to boost an output impedance. This technique is known as a "cascode" topology. The two transistors 502 and 504 generate the current at LO frequency based on input signals of $V_{CASC}$ and $V_{LO}$ provided by a local oscillator. Transistor 506 ("IF+") and transistor 508 ("IF−") steer the current to the right or left path depending on a value of the input digital signal "Q" and "$\overline{Q}$". The input signal is digital, high or low, and is transformed to the output analog current "$I_{REF}+$" or "$I_{REF}-$".

Figure 6:
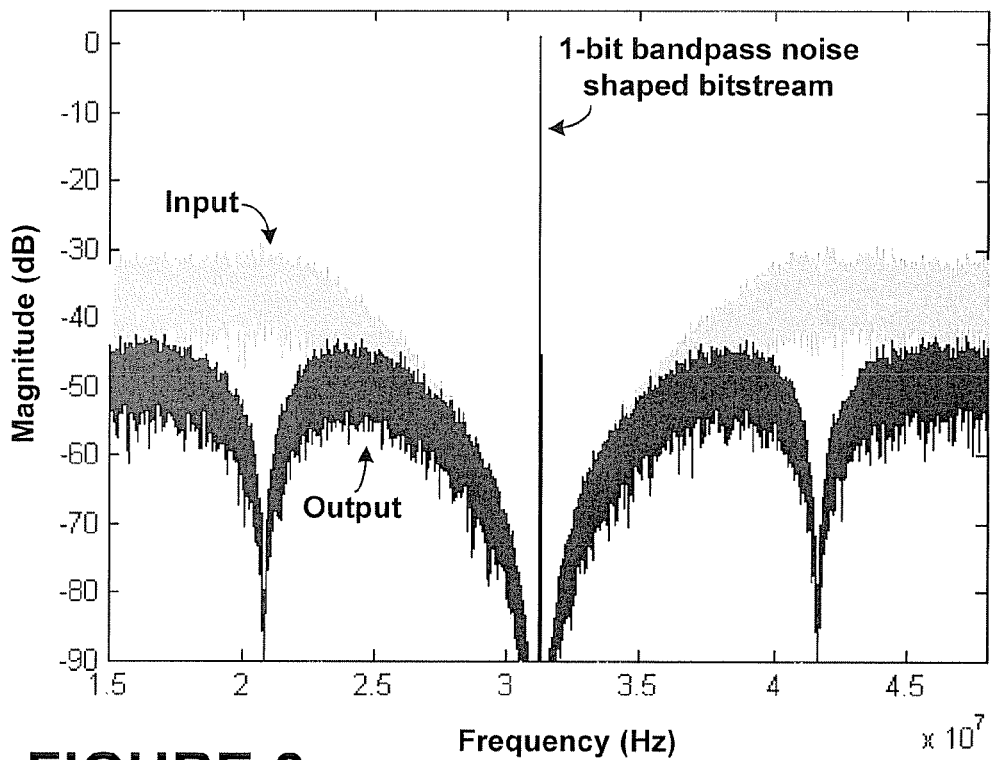
FIG. 6 illustrates an example spectrum of an input to an FIR filter and a corresponding output.

In one embodiment, a 6-tap FIR filter is used to receive a good balance between noise filtering and output impedance. Even more taps may be used as well, such as 20 taps within uses involving WCDMA and WLAN, for example. FIG. 6 illustrates an example spectrum of an input to the FIR filter 400 and a corresponding output. The output is a 1-bit bandpass noise shaped bitstream at Fs=125 MHz where the quantization noise is significantly suppressed at adjacent channels. The zero locations of the FIR filter depend on the clock frequency and number of taps.

Maximum tolerable jitter is a function of the output signal frequency and the signal bandwidth; therefore the clock jitter can be troublesome especially in bandpass D/A converters. The signal to noise plus distortion ratio (SNDR) degradation due to jitter is high in 1-bit ΔΣ D/A converters as the clock jitter impacts the output at full-scale each time the decision circuits toggle and there is timing error in the clock. The maximum allowable clock jitter is a function of the high-frequency out-of-band quantization noise; therefore a high-order FIR filter can relax the jitter requirements. Jitter impacts the output of the digital to analog converters at times that there is a transition in the bitstream coming from the I/Q mixer. Indeed, if the input signal is constant the digital bit remains the same and clock jitter does not affect the DAC output.

Figures 7A, 7B:
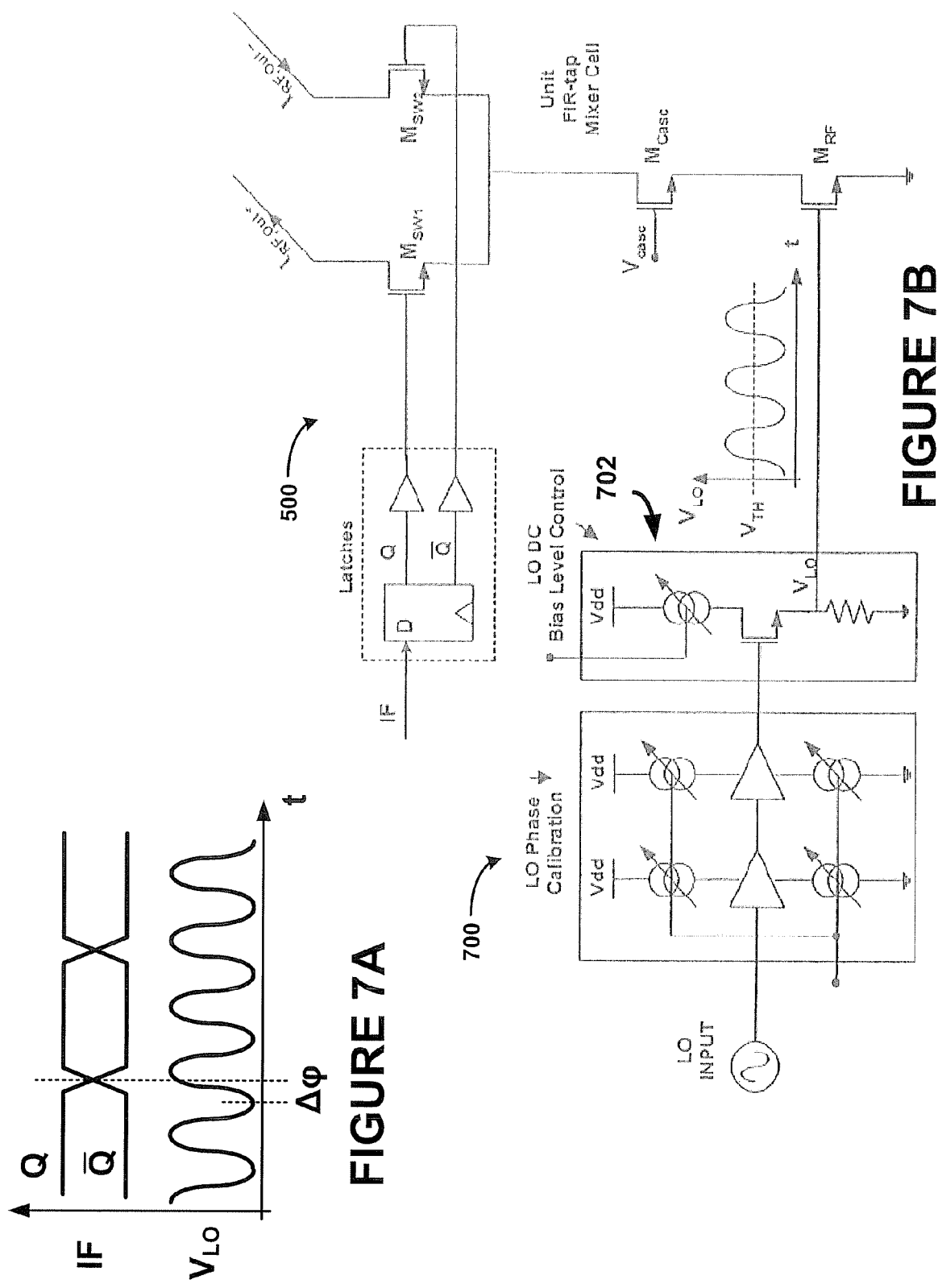
FIG. 7A illustrates an example of a LO null and IF transition alignment (i.e., $\Delta\phi=0$).
FIG. 7B illustrates one example of a variable delay buffer and programmable common mode buffer added to the unit FIR tap of FIG. 5.

Phase noise may accompany the digital IF signal due to the finite clock timing accuracy and also because the jitter accumulates in digital blocks as the signal propagates through buffers and gates. In one embodiment, IF signal transition phase noise impact is minimized by appropriate LO phase alignment. The optional phase alignment between LO and IF contrasts with typical single balanced mixers. Aligning LO signal nulls (the time instances where the RF transistor is in inversion) with IF data transitions, impact of IF data jitter on output SNR can be minimized because the current sources are turned off at the time that glitches and input dependant transients occur. The minimum voltage of LO may need to be below the threshold voltage of the tail NMOS device (transistor 502 in FIG. 5), because even sub-threshold current can convey glitches, transient errors and jitter induced errors to the output. FIG. 7A illustrates a LO null and IF transition alignment (i.e., $\Delta\phi=0$). The delay $\Delta\phi$ which contains frequency divider and clock buffers delay can be measured by post-layout simulations and $\Delta\phi$ can be set to 0 by design, but the delay would still vary by process variations and from die to die.

To compensate for unknown delays, a variable delay buffer can be added to the unit FIR tap 500 shown in FIG. 5. One example of such a variable delay buffer 700 is illustrated in FIG. 7B. A LO input signal with a programmable direct current (DC) bias level controls the rail current source bias (e.g., transistor "$M_{RF}$" in FIG. 7B). A LO DC bias level is controlled with a programmable DC buffer 702. The RF DAC also has a programmable phase delay between the RF LO and bandpass IF bitstream to ensure precise phase relationship between the LO transitions with respect to an IF update clock. Rise and fall time mismatches and glitch energy at IF data transitions can fold out-of-band quantization noise energy and spurs into the signal band, reducing the in-band SFDR. By phase aligning LO nulls to IF clock transitions, signal dependent glitches at the IF output are minimized. The variable delay buffer 700 provides adjustable time delay in the path of LO signal. The current sources of current starved inverters are used to change the delay.

Figure 8:
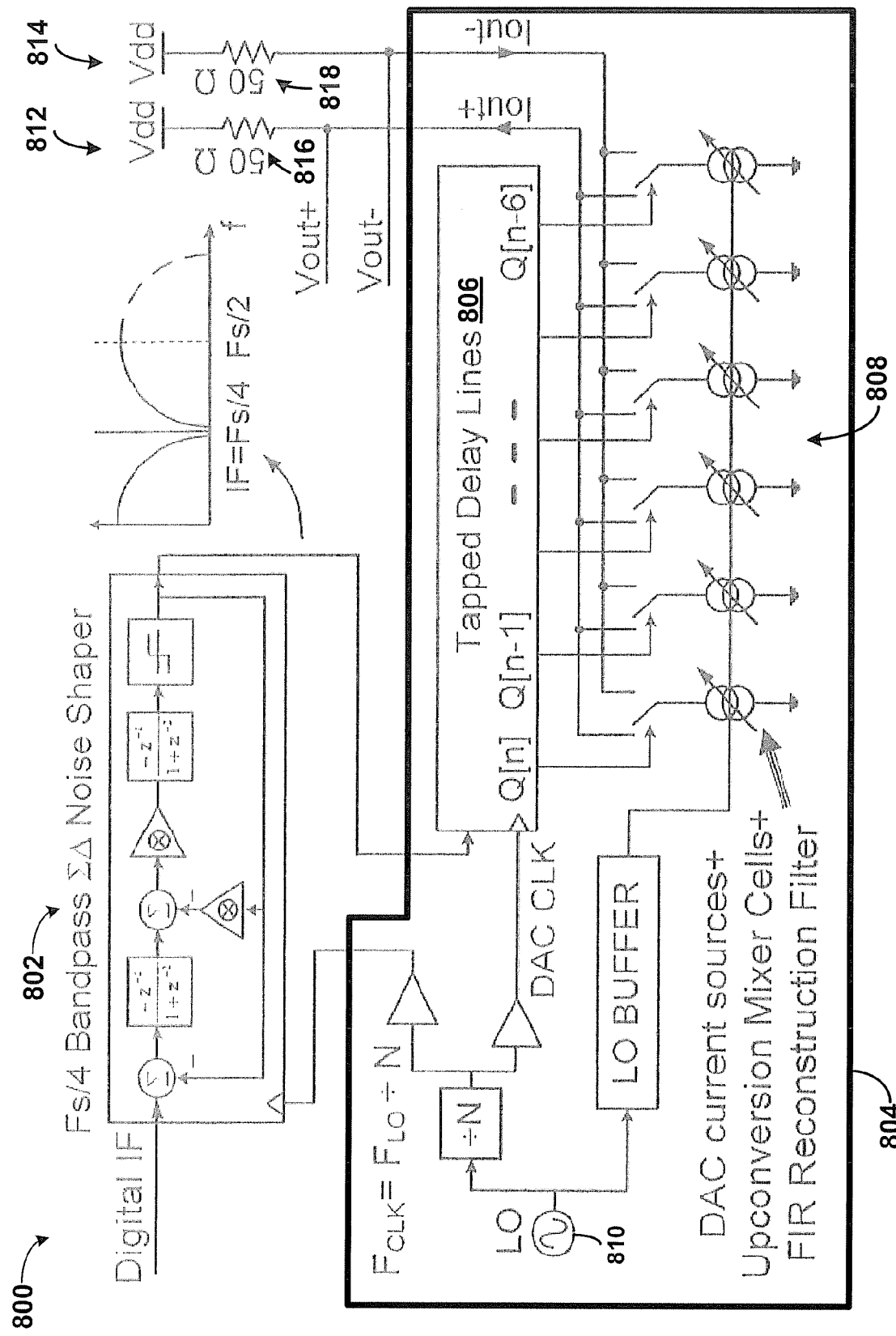
FIG. 8 illustrates a detailed view of an example of a transmitter according to exemplary embodiments.

FIG. 8 illustrates a detailed view of an example of a transmitter 800 according to exemplary embodiments. As with the transmitter shown in FIG. 1, the transmitter 800 includes a bandpass $\Sigma\Delta$ modulator 802 coupled to a finite impulse response radio frequency digital-to-analog converter (FIR RF DAC) 804. A digital intermediate frequency (IF) signal may be generated by a direct digital frequency synthesizer (DDFS) and input to the bandpass $\Sigma\Delta$ modulator 802. In this example, the bandpass $\Sigma\Delta$ modulator 802 is a fourth order bandpass ($\Sigma\Delta$) modulator with a noise transfer function centered at Fs/4, where Fs is the IF signal sampling frequency. IF clock phase noise coming from a DDFS can convolve with out-of-band quantization noise of the IF bitstream and increase in-band signal to noise ratio (SNR) of a corresponding radio frequency (RF) output. Therefore, the single-bit output of the bandpass ($\Sigma\Delta$) modulator is re-sampled by a low-noise IF clock buffer. The IF data and buffered clock lines drive a tapped digital delay line 806 (e.g., FIR filter). In this example, the tapped delay line 806 includes 6-taps (Q[n] to Q[n−1]), however, more or less taps may be used. The outputs of the delay line 806 are connected to cascoded switching pairs forming a current-mode semi-digital FIR filter.

To up-convert the signal to RF, RF DAC tail current sources 808 are switched by a LO signal 810. By combining the mixing operation at the DAC bias (which is the transistor "MRF" shown in FIG. 7), there is no need for a stand-alone mixer, reducing power consumption, area, and more significantly, noise generated by the mixer. Overall linearity of the transmitter can also be increased. In a typical Gilbert mixer, the linearity is limited by the IF input transistors and the noise figure (NF) of the mixer is well over 7 dB. However, within present embodiments, a bandpass modulated rail-to-rail IF signal is utilized for switching the pass transistors between triode and cutoff regions yielding good inter-modulation performance compared to a DAC followed by a Gilbert-cell mixer.

Thus, within exemplary embodiments, components for filtering, converting and mixing from typical transmitter designs have been combined within one DAC. Within FIG. 8, functionality of the current sources and the LO buffer form a mixer, while the DAC and FIR filter are merged into one. A combination of the switches and delay lines may be interpreted as performing the functionality of the DAC and FIR filtering.

For example, as shown in FIG. 8, the FIR RF DAC 804 receives a digital input signal and for each digital bit received (e.g., 0 or 1), the FIR RF DAC 804 decides to propagate a current to a first output path 812 or a second output path 814. Thus, for every combination of digital inputs, a certain number of currents are propagated to the first or second output paths. Each unit of the tapped delay line 806 directs a current to be propagated along one of the first or second output paths 812 or 814. Output voltage levels are provided across a first resistor 816 (Vout+) and a second resistor 818 (Vout−), thus transforming the digital inputs to unique analog voltage outputs.

For each digital input, the output is a function of previous inputs as well, due to the tapped delay line. A 6-tap delay line is shown in the example in FIG. 8, thus, the inputs are shifted over time, and after an input is shifted past Q[n−6], the input is discarded. Depending on a length of the delay line, an input may be kept for a period of time.

As an example, assuming the currents along each tap of the 6-tap delay line shown in FIG. 8 are I1=I2= . . . =I6=100 μA and the first resistor 816 and the second resistor 818 are 50 ohms, then the differential analog output "$V_{out+}$" and "$V_{out-}$" corresponding to examples of input digital bits are shown in Table 1 below.

TABLE 1

| Q1[n] | Q2[n] | Q3[n] | Q4[n] | Q5[n] | Q6[n] | Iout+ (μA) | Iout− (μA) | Vout (V) |
|---|---|---|---|---|---|---|---|---|
| 1 | 1 | 1 | 1 | 1 | 1 | 600 | 0 | 30m |
| 0 | 0 | 0 | 0 | 0 | 0 | 0 | 600 | −30m |
| 1 | 1 | 1 | 0 | 0 | 0 | 300 | 300 | 0 |
| 1 | 1 | 1 | 1 | 0 | 0 | 400 | 200 | 10m |
| 0 | 0 | 1 | 1 | 1 | 1 | 400 | 200 | 10m |
| 0 | 0 | 0 | 0 | 1 | 1 | 200 | 400 | −10m |

The novel DAC receives a digital input signal and outputs an analog radio frequency signal for transmission. Using the new design requires less silicon die area than previous designs, reduces complexity, requires less power and may be cheaper. The current steering DAC combines scaled values of local oscillator (LO) signals as current sources for performing current steering and upconversion in a single cell.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above concepts and methods are used.

It should be understood that the programs, processes, methods and systems described herein are not related or limited to any particular type of computer or network system (hardware or software), unless indicated otherwise. Various types of general purpose or specialized computer systems may be used with or perform operations in accordance with the teachings described herein.

In view of the wide variety of embodiments to which the principles of the present application can be applied, it should be understood that the illustrated embodiments are exemplary only, and should not be taken as limiting the scope of the present application. For example, the steps of the flow diagrams may be taken in sequences other than those described, and more or fewer elements may be used in the block diagrams. While various elements of embodiments have been described as being implemented in hardware, in other embodiments software or firmware implementations may alternatively be used, and vice-versa.

The claims should not be read as limited to the described order or elements unless stated to that effect. Therefore, all embodiments that come within the scope and spirit of the following claims and equivalents thereto are claimed as the invention.

What is claimed is:

1. A radio frequency transmitter comprising:
    a bandpass ΣΔ modulator for receiving digital input samples and converting the digital input samples to a one-bit data stream; and
    a finite impulse response radio frequency digital-to-analog converter (FIR RF DAC) coupled to the bandpass ΣΔ modulator, wherein the FIR RF DAC includes:
        (i) a current-steering finite impulse response (FIR) filter to provide out-of-band quantization noise filtering at Radio Frequencies (RF); and
        (ii) an embedded upconversion mixer combined with a digital-to-analog converter bias for providing a corresponding analog output signal in the form of the radio frequency signal; and
    wherein the FIR RF DAC is capable of transforming the one-bit data stream into a radio frequency signal.

2. The radio frequency transmitter of claim 1, wherein the embedded upconversion mixer is driven by a signal from a local oscillator.

3. The radio frequency transmitter of claim 2, wherein signal nulls of the local oscillator are aligned with data transitions within the digital input samples.

4. The radio frequency transmitter of claim 2, further comprising a variable delay buffer coupled to the FIR RF DAC, wherein the variable delay buffer controls a bias to the embedded upconversion mixer to provide an adjustable time delay in the signal from the local oscillator.

5. A digital to analog converter (DAC) comprising:
    a finite impulse response (FIR) filter to transform a digital input signal to a bandpass response centered at a sampling frequency;
    a tapped delay line for receiving the bandpass response from the FIR filter, wherein each unit of the tapped delay line includes a mixer and an amplifier transistor to generate an analog current, and wherein each unit of the tapped delay line further includes a first transistor and a second transistor to steer the analog current to a desired output path based on a value of the bandpass response;
    a first output path for receiving the analog current from the first transistor from each tapped delay line and outputting a first analog voltage across a first output resistor, wherein the first analog voltage is due to a sum of analog currents received from units of the tapped delay line and propagated across the first output resistor; and
    a second output path for receiving the analog current from the second transistor from each tapped delay line and outputting a second analog voltage across a second output resistor, wherein the second analog voltage is due to a sum of analog currents received from units of the tapped delay line and propagated across the second output resistor.

6. The digital to analog converter (DAC) of claim 5, further comprising an embedded mixer to provide a periodic current at a local oscillator (LO) frequency to drive the mixer and amplifier transistor.

7. The digital to analog converter (DAC) of claim 6, wherein signal nulls of the local oscillator are aligned with data transitions within the digital input signal.

8. The digital to analog converter (DAC) of claim 7, further comprising a variable delay buffer coupled to the FIR filter.

9. The digital to analog converter (DAC) of claim 8, wherein the variable delay buffer controls a bias to the mixer to provide an adjustable time delay in a local oscillator input signal that drives the mixer.

10. The digital to analog converter (DAC) of claim 5, wherein the FIR filter includes a digital delay line with a cascade of delay blocks that transform the digital input signal to the bandpass response centered at the sampling frequency.

11. The digital to analog converter (DAC) of claim 5, wherein the FIR filter has a transfer function given by:

$$H(z) = -a_1 \cdot z^{-2} + a_2 \cdot z^{-4} - \ldots + (-1)^N a_N \cdot z^{-2N}$$

where $a_1$ to $a_n$ are filter coefficients.

12. The digital to analog converter (DAC) of claim 11, wherein the filter coefficients are set to be symmetric around a center tap so that the FIR filter has a linear phase response.

13. The digital to analog converter (DAC) of claim 5, wherein the mixer and the amplifier transistor are provided in a cascode topology.

14. The digital to analog converter (DAC) of claim 5, wherein the mixer and the amplifier transistor are connected in series to one another and provide the analog current to each of the first transistor and the second transistor.

15. The digital to analog converter (DAC) of claim 14, wherein the value of the bandpass response turns either the first transistor or the second transistor on, so as to connect the analog current to either the first output path or the second output path.

16. The digital to analog converter (DAC) of claim 5, wherein the first analog voltage and the second analog voltage correspond to analog values of received digital input signals.

17. A method comprising:
    receiving a digital input signal;
    transforming the digital input signal to a bandpass response centered at a sampling frequency;
    generating a plurality of analog currents;
    providing each of the plurality of analog currents to a desired output path based on a value of the bandpass response; and
    outputting an analog voltage across an output resistor due to a sum of analog currents received.

18. The method of claim 17, further comprising providing a periodic current at a local oscillator (LO) frequency to generate the plurality of analog currents.

19. The method of claim 18, further comprising aligning signal nulls of the local oscillator with data transitions within the digital input signal by providing an adjustable time delay at the local oscillator.

* * * * *